United States Patent [19]

Slingsby

[11] 4,034,433

[45] July 12, 1977

[54] WASH-OFF PROCESSOR

[75] Inventor: Thomas W. Slingsby, Old Saybrook, Conn.

[73] Assignees: Richmond Graphic Systems, Inc., Providence, R.I.; Andograin-Kulka, B. V., Netherlands

[21] Appl. No.: 556,895

[22] Filed: Mar. 10, 1975

[51] Int. Cl.² .................................. G03D 5/06
[52] U.S. Cl. ................................................ 15/77
[58] Field of Search ............... 15/77, 100, 102; 118/103, 112, 114

[56] References Cited

U.S. PATENT DOCUMENTS

| | | | |
|---|---|---|---|
| 1,183,672 | 5/1916 | Ritchey et al. | 15/77 |
| 1,529,691 | 3/1925 | Davis | 15/77 X |
| 1,888,498 | 11/1932 | Gipe et al. | 15/77 |
| 2,199,062 | 4/1940 | Avery | 15/77 |
| 2,297,976 | 10/1942 | Nachtman | 15/77 |
| 2,509,957 | 5/1950 | Briggs | 15/77 X |
| 2,632,197 | 3/1953 | Moss et al. | 15/77 X |
| 2,680,938 | 6/1954 | Peterson | 15/77 X |
| 3,292,194 | 12/1966 | Randall | 15/77 |
| 3,562,834 | 2/1971 | Stievenart et al. | 15/77 X |
| 3,809,105 | 5/1974 | Horner | 15/77 |

*Primary Examiner*—Edward L. Roberts
*Attorney, Agent, or Firm*—Duckworth, Hobby, Orman, Allen & Pettis

[57] ABSTRACT

A processor for photographic plates or like elements comprising a housing through which the plates being processed travel and further including a plurality of work stations at least comprising a developer station, a scrubbing station and a wash-off station. The scrubber station comprises a rotatably mounted brush or like scrub element disposed in engaging relation to plates passing along the path of travel defined in the housing. A flexible backup element preferably in the form of a continuous flexible belt is disposed on the opposite side of the path of travel relative to the rotating brush wherein plates being processed, when passing between the brush and the backup element will undergo a scrubbing action on the surface exposed to the brush while receiving sufficient support from the backup element to allow the scrubbing action to take place. A plurality of other work stations including a washer station, dryer station, fixer station and squeegee application may be applied to the plates as they pass through the processor.

15 Claims, 8 Drawing Figures

WASH-OFF PROCESSOR

BACKGROUND OF THE INVENTION

1. Field of the Invention

This invention relates to a device for processing photographic plates wherein the process to which the plates are subjected may include exposure to developing fluid in addition to a wash-off facility incorporating a scrubbing action to remove preselected portions of the exposed material placed on predetermined surfaces of the photographic plates.

2. Description of the Prior Art

In the graphic arts industry, the existence and value of machines and methods for developing and processing of wash-off reproduction materials is well recognized. There are numerous types of wash-off systems, the majority of which are designed for use in combination with bichromate and diazo emulsion coating. Wash-off processing, however, is not limited to these restricted chemical families. During processing, a number of photographic emulsions harden on exposure and development. Others are caused to adhere to the base sheet more positively. One group of silver emulsions, (colloid tanning agents, and a reduceable silver salt which, on exposure to light, yields a tanned insoluble negative image) can be coated on materials including cloth, paper and stable base films. The non-image areas are soluble in water or developer and are washed away during processing. Other techniques coat substrates with diazo compounds which, when exposed and developed, harden and adhere to the base material. Unexposed areas are easily removed with developer or water. Both auto-positive and negative working materials are available for such application. Similarly a full range of colored material is available in addition to the commonly used black.

The materials mentioned above, as well as others commonly known in the graphic arts industry can presently be processed by hand rubbing exposed materials with activator and water washing, (manual rub) or spraying. After wash-off it is common to use any conventional film dryer for drying the copy or the copy can simply be hung on a line for atmospheric drying.

In approximately the last ten years there has been increased activity on the part of those involved in the graphic arts industry for development of additional wash-off material. Emulsion technology has provided a faster development and higher densities, not to mention improved image adhesion coupled with ease in wet removal of image. The major manufacturers and development in this industry are and have been at work in several areas of the wash-off processing.

While wash-off processing has become increasingly active in the graphic arts industry, hardware utilized for this processing is still relatively high priced because of the unnecessary sophistication of structure design used in these processors. Hardware wash-off processors presently commercially available and generally in the range from $12,000 to $25,000. It has been found, however, that even with this relatively sophisticated and overly complex equipment, performance in a number of the presently commercially available machines, in terms of quality of product being processed is less than satisfactory. In wash-off processing, removal of certain waste particles from the exposed surface of the plate must be accomplished without scratching or otherwise causing abrasion between the removal element and the developed portion of the surface of the plate.

Accordingly, there is a great need in the graphic arts industry for a simple, easily operated relatively low cost machine that provides a dry-to-dry wash-off processing facility at relatively fast processing speeds. Such machine should be capable of eliminating scratching and other damage to sheets or plates that are processed.

SUMMARY OF THE INVENTION

The present invention is directed to a processor for processing photographic sheets covered with a photo-sensitive coating on at least one surface thereof wherein the processor of the subject invention incorporates at least a developer station, and a scrubbing station to effect removal of predetermined portions of the photo-sensitive coating after this photo-sensitive coating is treated with developer fluid.

More specifically, the processor of the subject invention includes a scrubbing station comprising a scrubbing element rotatably mounted within the housing and disposed in plate engaging relation to the path of travel which the plates being processed take as they travel through the processor. A transporting means comprising one or more sets of drive rolls as well as the various other structural elements to be described hereinafter at least partially determine the path of travel of the plate in that the plates are driven in engagement with one or more of these driving elements as they pass through the machine.

The scrubbing station of the processor further includes backup means including a flexible backup element which preferably comprises a continuous, flexible belt. The belt is disposed on the opposite side of the path of travel of the plate relative to the scrub element, which in its preferred form, comprises a rotatably mounted brush. As the plate passes through the scrubbing station its "upper" surface (when the plate is traveling in a substantially horizontal path) engages the belt and travels along therewith. The scrubbing brush is connected to driving means which in turn may be separated from or be a part of the driving means which is drivingly connected to the transporting means as well as the other moving parts of the processor. Speeds of the components can be preselected and varied, based on the application of conventional gearing and linkage arrangement which is quite well known in the art. The drive means associated with the scrub brush maintains the scrub brush at a rotational speed substantially greater than the peripheral speed of the belt. Accordingly, while the plate being processed is fixedly maintained relative to the belt as it travels along therewith, the rotating brush provides a scrubbing action to the surface of the plate which it engages due to the fact that the brush is rotating at a faster speed and, possibly in an opposite direction to that rotation of the continuous belt.

It should be noted that the speed of the brush should be such as to develop sufficient centrifugal force to cause particles, dislodged from the surface being scrubbed, to be directed away from the path of travel of the plate and the brush itself. In this manner, the brush would be self-cleaning.

A fluid delivery system includes a nozzle which is mounted within the scrub element. In the preferred embodiment of the present invention, the nozzle means is mounted on the interior of an apertured core which forms part of the brush. Bristle means of predetermined dimension are attached to the apertured core and thereby defined as a scrub element having a substantially "open" configuration. This open configuration may be defined by the fact that fluid directed from the nozzle in the direction of the path of travel defines a path of fluid flow defined by the apertured core and the spaced apart bristles of the brush. It should be noted that other structural embodiments of the scrub element may be incorporated through the brush onto the plate being processed in the present invention. Such other embodiments may include a porous or apertured core being attached to a liquid permeable material, such as foam, sponge, etc. wherein, in this embodiment, the open configuration may be defined by the fact that the core and liquid permeable material at least partially defines a path of fluid flow therethrough onto the plate being engaged by the scrub element. The nozzle is disposed and configured to direct the stream of fluid generally at the point of contact of the outer periphery of the brush element or scrub element and the correspondingly positioned surface of the plate being processed.

In yet another embodiment of the present invention the nozzle means may be substantially contiguous to the core itself. The core or supporting means for the bristles may engage the outer surface of the nozzle itself. A plurality of apertures, through which fluid flows, are formed at various predetermined points along the surface of the nozzle and not necessarily along a straight line. By virtue of the configuration of the apertures, fluid may be directed through the brush about its entire circumference rather than along just one restricted path. In this embodiment the nozzle may be fixedly attached to the brush and be rotatably mounted on the casing or housing to rotate with the brush.

The fluid delivery system may further comprise fluid reservoir means, pump means and filter means all disposed in fluid communicating relation in a closed, substantially continuous recirculating fluid system. Alternately, or in conjunction with the above discussed fluid delivery system, the processor may comprise a temperature regulator means to regulate the temperature of fluid passing through the brush onto the plate being processed.

The processor may further include a wash station comprising spray heads or any other applicable means of providing wash-off liquid to the process plate after the scrubbing station. This wash station is located downstream and preferably adjacent to the scrub station so as to insure removal of any particles from the surface of the process plate thereby insuring high quality reproductive capabilities.

A plurality of fixture stations and/or other treatment stations may be incorporated downstream of the wash station and scrubber station respectively depending upon the particular application, photo-sensitive coating utilized, or type material plate being processed.

A drying station incorporating a fan means disposed in fluid communicating relation with the path of travel may also be provided in an inline fashion in the housing of the processor.

Squeegee means in the form of a pair of squeegee rollers disposed on opposite sides of the path of travel and in engagement with the oppositely disposed surface of a plate may be located preceding the drying station and/or in cooperative plate engaging relation relative to the path of travel of any of the steps aforementioned as desired to accomplish maximum efficient transporting of the photographic plates to the processor and specifically through any of the stations incorporated within the processor.

The invention accordingly comprises the features of construction, combination of elements and arrangement of parts which will be exemplified in the construction hereinafter set forth and the scope of the invention will be indicated in the claims.

BRIEF DESCRIPTION OF THE DRAWINGS

For a fuller understanding of the nature and objects of the invention, reference should be had to the following detailed description taken in connection with the accompanying drawings in which:

FIG. 7 is an end sectional view of another embodiment of the brush of the present invention.

FIG. 8 is a detailed side view of another embodiment of the nozzle means.

Similar reference characters refer to similar parts throughout the several views of the drawings.

DETAILED DESCRIPTION

Figure 1:
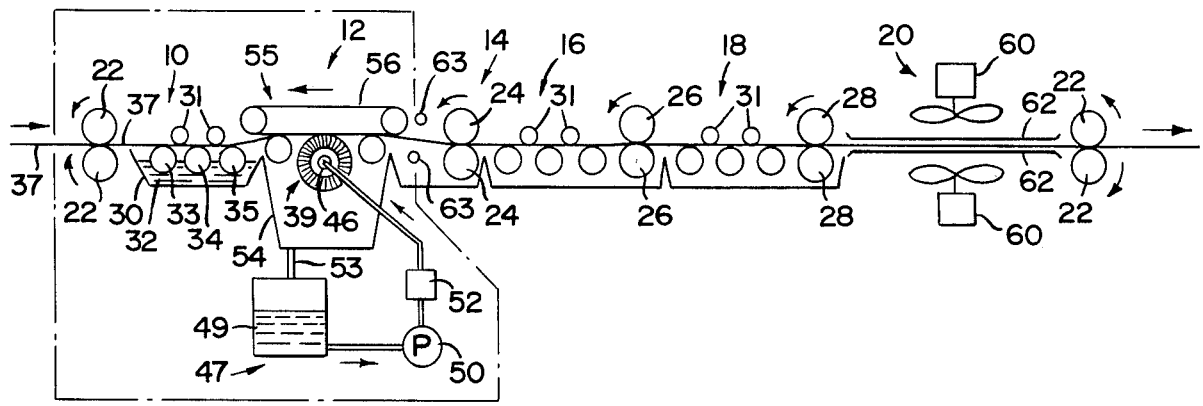
FIG. 1 is a schematic view of the processor wherein the housing is generally represented in broken lines as incorporating predetermined stations being utilized.

As shown in FIG. 1, the processor of the present invention comprises a developing station generally indicated as 10, a scrub station generally indicated as 12 and a wash station generally indicated as 14. In addition, supplementary stations may be incorporated in the process depending upon the particular application which the processor is designed to be adapted for. More specifically, the fixing station 16 and a hardening station 18 may be incorporated within the processor. A drying station generally indicated as 20 may also be incorporated downstream of the wet application stations so that from start to finish the application may comprise a dry to dry process incorporating a wash-off facility in the processor.

Transporting means in the form of a plurality of drive rolls 22 are located along the path of travel which a photographic plate travels as it passes through the processor. Additional squeegee rollers 24, 26 and 28, in addition to performing a drying step by removing excess moisture, also aid in the transporting of the plate along the path of travel. As such, they may be considered a part of the transporting means. A driving means in the form of conventional chain linkage, etc. driven by some type of conventional prime mover such as an electric motor is interconnected to each of the driving rolls and movable rolls along the path of travel and movably mounted within the processor.

The developer station comprises tank 30 designed to hold developer fluid 32 therein. Applicator rolls 33, 34 and 35 are arranged so as to apply the developer liquid 32 to the plate schematically indicated by line 37. Guide rolls 31 help define the path of travel as indicated.

Scrub station 12 comprises scrub element 39 which, in the preferred embodiment (FIG. 2) is in the form of a rotating brush 40. Brush 40 comprises a central core 42 having an apertured configuration so as to allow fluid to pass therethrough. A plurality of bristle means 44 arranged in spaced relation to one another and mounted on core 42. The predetermined space between bristles 44 allows for fluid to be directed therethrough. A nozzle means 46 is mounted on the interior of core 42 in such a manner as to be disposed along the length of core 42 and direct water through aperture means 48 through core 42 as it rotates and through the individual bristle means 44 onto plate 37. Nozzle means 46 is a part of fluid delivery means generally indicated as 47 which comprises a reservoir 49 full of wash-off fluid interconnected in fluid communication to pump 50 and filter 52. Conduit means 53 serves to interconnect the various elements including the reservoir 49, pump 50 and filter 52 and nozzle 46. Tank 54 is positioned immediately adjacent to the brush 40 so that fluid issuing from nozzle 46 passes through the brush 40 onto plate 37 where it falls back from the plate 37 into tank 54 and passes through conduit 53 back into the reservoir. Filter means 52 serves to filter out all the particles removed from plate 37 before the recirculating wash-off fluid is directed back onto plate 37.

As shown in FIG. 7, another embodiment of the brush shows nozzle means 146 fixedly attached to the brush 140 and core 142 so as to rotate therewith. Water or washoff fluid passes through the nozzle means 146 by a plurality of apertures 148 located in spaced relation to one another along the surface of the nozzle means 146 as shown in FIG. 8.

Figure 2:
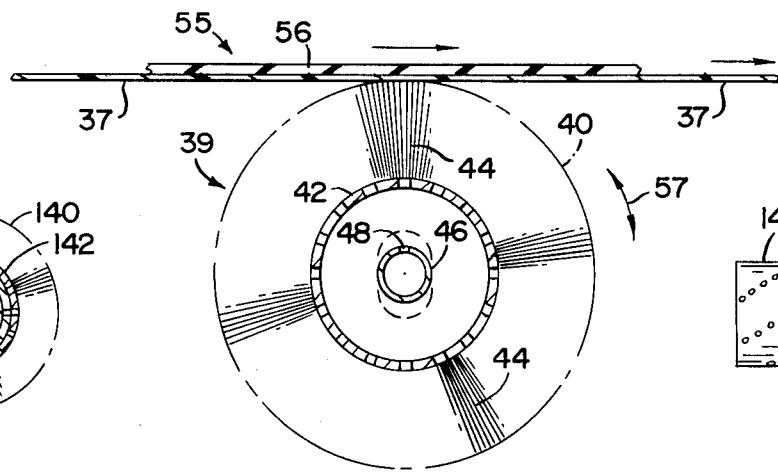
FIG. 2 is an end sectional view of details of the interior of the scrub element in the form of a rotating brush in its cooperative relation to a plate and scrub backup means associated with the scrub station.
Figure 3:
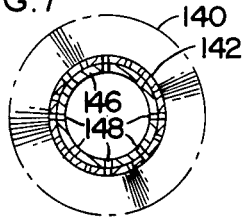
FIG. 3 is one embodiment of the present invention utilizing a method of applying the developer liquid immediately prior to the plate being passed through the scrub station.
Figure 3:
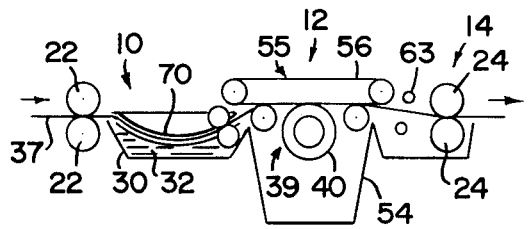

A scrub backup means generally indicated as 55 comprises a flexible backup element which, in the preferred embodiment, is shown as a continuous flexible belt 56 (FIGS. 1 and 2). Flexible belt 56 is rotating continuously in the direction of travel of the plate as it passes along the path of travel through the processor. Brush 40 may travel in either direction as indicated by directional arrow 57 and the bristles 44 are disposed to engage a predetermined surface of the plate 37 to remove certain portions of the photo-sensitive coating after they have been exposed to the developer fluid 32. It should be noted that the brush 40 is rotationally driven relative to the plate 37 and backup element 40 is rotationally driven relative to plate 37 and backup element 56 as discussed above by means of its interconnection to the drive means serving to rotate in driving relation the other rolls 22 and other structural components which comprise the transporting means. It may be preferable to drive the brush means from a separate motor and gearing arrangement (not shown) not connected to the transporting means. It should further be noted that in the preferred form the rotating brush travels at a speed in excess of the peripheral speed of the flexible element 56 and may be in the range from 10 to 150 times as fast so as to provide the proper scrubbing action. The centrifugal force created by the brush due to its speed causes the particles to be adequately removed from the surface of the plate 37 as it passes between the backup element 56 and the brush 40. The force of fluid as it is directed through the brush onto the plate also serves to promptly remove these particles rather than keep them in the brush or in contact with the surface of the plate 37. Proper removal of the particles is important to avoid unnecessary abrasiveness or scratching of the remaining portion of the surface on plate 37. Fixing station 16 and hardening station 18 may have similar type applicator means as explained with reference to the developer station 10. It should be noted that these supplementary stations 16 and 18 are not a necessary part of the invention per se but may be added, dependent upon the particular application desired.

Drying station 20 comprises one or more fan units 60 exposed to both surfaces of the plate and guide means 62 located on opposite sides of the path of travel. The fan means 60 is disposed so as to direct currents of air or dry fluid onto the plate thereby aiding the drying process. Again, the feeding rolls 22, 24, 26 and 28 may all provide a squeegee action so as to remove excess moisture, further aiding in the drying process.

Located immediately downstream and adjacent to the scrub station 12 is the wash station 14 comprising spray heads 63 used to direct wash-off onto both sides of the plate 37 as it passes therethrough. Squeegee rollers 24 are provided to remove the excess moisture.

The structure shown in FIGS. 3, 4, 5 and 6 are directed to different embodiments wherein the applicator means of the developing fluid in tank 30 comprises various structural modifications. More specifically, in FIG. 3, the plate 37 travels along the path of travel and is passed through an arcuate shaped guide 70 so as to submerge the plate in the bath of developer fluid 32.

Figure 4:
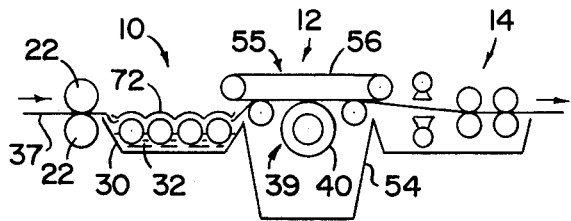
FIG. 4 is yet another embodiment of means of applying developer liquid in the developing station of the processor.

FIG. 4 shows the use of a "kiss" process wherein the path of travel is defined along substantially corrugated plate 72 which itself is arranged in fluid communication to the developer fluid 32 and tank 30.

Figure 5:
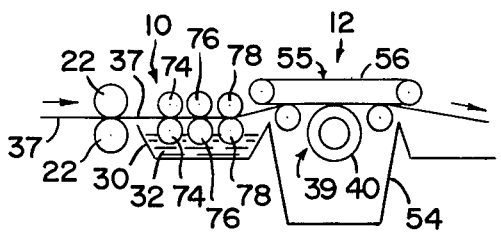
FIG. 5 is yet another embodiment of the present invention showing means of applying developer fluid to the plate being processed.

Similarly, FIG. 5 uses a plurality of applicator rolls 74, 76 and 78 which are arranged at least in part in fluid communication with fluid 30 so as to develop a meniscus on the undersurface of the plate and thereby provide adequate amounts of developer fluid 32 to the photo-sensitive coating of the undersurface of plate 37.

Figure 6:
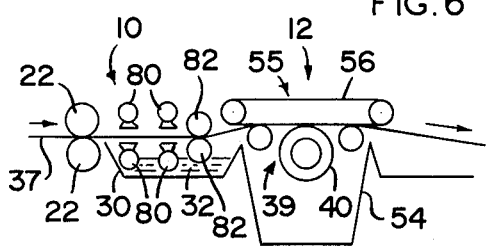
FIG. 6 is yet another embodiment of the present invention showing a modified form of developer liquid application.

As shown in FIG. 6, yet another embodiment of the present invention comprises a plurality of spray heads 80 arranged in spaced relation to one another and interrconnected in fluid communication with the developer fluid 32 whereby spray heads 80 direct developer fluid onto both surfaces of the plate 37 as it passes along the path of travel. Squeegee rolls 82 may be disposed in the path of travel so as to remove excess moisture from plate 37 as is commonly known in the art.

It will thus be seen that the objects set forth above, among those made apparent from the preceding description, are efficiently attained, and since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all the generic and specific features herein described, and all statements of the scope of the invention which, as a matter of language, might be said to fall therebetween.

Now that the invention has been described, what is claimed is:

1. A processor for photographic plates of the type incorporating a wash-off facility, said processor comprising: a housing, transporting means movably connected to said housing and disposed to at least partially define a path of travel of the plates through said housing, drive means movably connected to said transporter means in driving relation thereto, whereby said transporting means operates at a preselected speed to transport the plates through said housing; a developer station disposed in fluid communication with said path of travel; at least one scrub station comprising a scrub element rotatably mounted within said housing in plate engaging relation to said path of travel, said scrub element comprising a substantially open configuration at least partially defining a path of fluid flow through said scrub element, fluid delivery means including nozzle means mounted on the interior of said scrub element and disposed to direct fluid therefrom along said path of fluid flow into said path of travel of the plate, scrub backup means including a flexible element movably mounted within said housing and extending along the length of said path of travel defined by the area of contact of said scrub element and the plate and further disposed both upstream and downstream of said scrub element, said scrub element and said flexible element disposed in cooperative relation to one another on opposite sides of said path of travel and plates passing therealong; both said flexible backup element and said scrub element connected to said drive means, said flexible backup element comprising a continuous belt connected in driven relation to said driving means and traveling at a peripheral speed less than that of said scrub element, said scrub element and said flexible backup means disposed to engage oppositely disposed surfaces of a plate traveling along said path of travel; said scrub element positioned relative to said path of travel so as to direct waste particles from the plate away from said path of travel, whereby the scrub element provides a scrubbing action to the preselected surface of the plate passing along said path of travel.

2. A processor as in claim 1 wherein said scrub element comprises a brush rotatably mounted within said housing in plate engaging relation to said path of travel, said open configuration at least partially defined by a porous core and spaced apart bristle means connected to said core, said nozzle means mounted on the interior of said core and disposed to direct wash-off fluid through said brush from the interior of said core onto plates passing along said path of travel.

3. A processor as in claim 2 wherein said nozzle means is fixedly attached to said brush and connected to rotate therewith.

4. A processor as in claim 2 wherein said nozzle means is disposed along the length of said core and includes a substantially uniform configuration, whereby a substantially uniform pattern of fluid is projected on the plate.

5. A processor as in claim 1 wherein the peripheral speed of said belt is substantially equal to the peripheral speed of said transporting means.

6. A processor as in claim 1 further comprising fluid reservoir means connected to said housing and disposed, at least in part, adjacent said scrub element; said fluid delivery system further comprising a pump means interconnected in fluid communicating relation between said nozzle means and said fluid reservoir.

7. A processor as in claim 1 wherein said fluid delivery system further comprises filter means disposed in fluid communicating relation between said nozzle means and said fluid reservoir.

8. A processor as in claim 1 wherein said fluid delivery system is connected in fluid communication to a source of wash-off fluid maintained at a temperature above ambient.

9. A processor as in claim 1 wherein said scrub element comprises a substantially roller configuration comprising an apertured core and a liquid permeable material mounted about the periphery of said core.

10. A processor as in claim 9 wherein said nozzle means is mounted on the interior of said core and disposed to direct fluid through said apertured core and said liquid permeable material into said path of travel.

11. A processor as in claim 1 further comprising a wash station disposed in said housing downstream of said scrub station, said wash station including wash fluid applicator means disposed in fluid communicating relation with said path of travel.

12. A processor as in claim 11 further comprising squeegee means connected to said housing downstream and adjacent to said wash fluid applicator means.

13. A processor as in claim 11 further comprising dryer means including impeller means mounted within said housing downstream of said wash station.

14. A processor for photographic plates of the type incorporating a wash-off facility, said processor comprising: a housing, transporting means movably connected to said housing and disposed to at least partially define a path of travel of the plates through said housing, drive means movably connected to said transporter means in driving relation thereto, whereby said transporting means operates at a preselected speed to transport the plates through said housing; a developer station disposed in fluid communication with said path of travel; at least one scrub station comprising a scrub element rotatably mounted within said housing in plate engaging relation to said path of travel, said scrub element comprising a substantially open configuration at least partially defining a path of fluid flow through said scrub element, fluid delivery means including nozzle means mounted on the interior of said scrub element and disposed to direct fluid therefrom along said path of fluid flow into said path of travel of the plate, scrub backup means including a flexible element movably mounted within said housing and extending along the length of said path of travel defined by the area of contact of said scrub element and the plate and further disposed both upsteam and downstream of said scrub element, said scrub element and said flexible element disposed in cooperative relation to one another on opposite sides of said path of travel and plates passing therealong; both said flexible backup element and said scrub element connected to said drive means, said flexible backup element comprising a continuous belt connected in driven relation to said driving means and traveling at a peripheral speed less than that of said scrub element, said continuous belt positioned in cooperative relation to said scrub element and above the path of travel and in plate engaging relation to plates passing along said path of travel, whereby the scrub element provides a scrubbing action to the preselected surface of the plate passing along said path of travel, due at least in part to gravity.

15. A processor for photographic plates of the type incorporating a wash-off facility, said processor comprising: a housing, transporting means movably connected to said housing and disposed to at least partially define a path of travel of the plates through said housing, drive means movably connected to said transporter means in driving relation thereto, whereby said transporting means operates at a preselected speed to transport the plates through said housing; a developer station disposed in fluid communication with said path of travel; at least one scrub station comprising a scrub element rotatably mounted within said housing in plate engaging relation to said path of travel, said scrub element comprising a substantially open configuration at least partially defining a path of fluid flow through said scrub element, fluid delivery means including nozzle means mounted on the interior of said scrub element and disposed to direct fluid therefrom along said path of fluid flow into said path of travel of the plate, scrub backup means including a flexible element movably mounted within said housing and extending along the length of said path of travel defined by the area of contact of said scrub element and the plate and further disposed both upstream and downstream of said scrub element, said scrub element and said flexible element disposed in cooperative relation to one another on opposite sides of said path of travel and plates passing therealong; both said flexible backup element and said scrub element connected to said drive means, said flexible backup element comprising a continuous belt connected in driven relation to said driving means and traveling at a peripheral speed less than that of said scrub element, said continuous belt and said scrub element disposed in cooperative relation to one another and in engagement with opposite surfaces of a plate passing along said path of travel, said scrub element comprising a rotatably mounted brush positioned beneath said path of travel and in plate engaging disposition relative thereto, whereby said brush provides a scrubbing action to the preselected, correspondingly positioned surface of the plate passing along said path of travel.

\* \* \* \* \*